(12) United States Patent
Liu et al.

(10) Patent No.: US 12,176,171 B2
(45) Date of Patent: Dec. 24, 2024

(54) SINGLE PASSIVE GATE-DRIVER FOR SERIES CONNECTED POWER DEVICES IN DC CIRCUIT BREAKER APPLICATIONS

(71) Applicants: Jian Liu, Blacksburg, VA (US); Lakshmi Ravi, Blacksburg, VA (US); Dong Dong, Blacksburg, VA (US); Rolando Burgos, Blacksburg, VA (US); Steven Schmalz, Waukesha, WI (US)

(72) Inventors: Jian Liu, Blacksburg, VA (US); Lakshmi Ravi, Blacksburg, VA (US); Dong Dong, Blacksburg, VA (US); Rolando Burgos, Blacksburg, VA (US); Steven Schmalz, Waukesha, WI (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 198 days.

(21) Appl. No.: 17/885,130

(22) Filed: Aug. 10, 2022

(65) Prior Publication Data

US 2023/0046316 A1 Feb. 16, 2023

Related U.S. Application Data

(60) Provisional application No. 63/231,329, filed on Aug. 10, 2021.

(51) Int. Cl.
*H01H 9/54* (2006.01)
*H01H 33/59* (2006.01)

(52) U.S. Cl.
CPC .......... *H01H 9/542* (2013.01); *H01H 33/596* (2013.01); *H01H 2009/543* (2013.01); *H01H 2009/544* (2013.01)

(58) Field of Classification Search
CPC ................. H01H 9/542; H01H 33/596; H01H 2009/543; H01H 2009/544; H03K 17/08148; H03K 17/107

(Continued)

(56) References Cited

U.S. PATENT DOCUMENTS

| 2015/0002977 A1* | 1/2015 | Dupraz | H01H 9/542 361/115 |
| 2022/0045506 A1* | 2/2022 | Wang | H02H 7/268 |

FOREIGN PATENT DOCUMENTS

| CN | 104052026 A | * 9/2014 | H02M 1/32 |
| CN | 205544196 U | * 8/2016 | |

(Continued)

OTHER PUBLICATIONS

Xue J; Title: low-voltage hybrid direct current breaker, has first capacitor whose end is connected with end of second capacitor, and insulating grid double-pole insulated gate bipolar transistor whose collector electrode is connected with switch; Figure and entire specification (Year: 2020).*

(Continued)

*Primary Examiner* — Dharti H Patel
(74) *Attorney, Agent, or Firm* — Perilla Knox & Hildebrandt LLP; James J. Rha

(57) ABSTRACT

Gate control of power semiconductor devices using reduced gate drivers is disclosed. A circuit breaker may include a multitude of transistors, such as insulated gate bipolar transistors (IGBTs), connected in series with one another. Each transistor may be connected to a respective gate resistor. Diodes may be connected between various gate resistors. One or more resistor-capacitor (RC) snubber circuits may be provided in parallel with one or more of the transistors. Likewise, one or more metal-oxide varistors (MOVs) may be connected in parallel to one or more of the transistors. A gate driver (e.g., a single gate drive) may be connected to the (Continued)

one or more diodes and an emitter of at least one of transistors.

20 Claims, 13 Drawing Sheets

(58) Field of Classification Search
USPC .............................................................. 361/2
See application file for complete search history.

(56) References Cited

FOREIGN PATENT DOCUMENTS

| CN | 210957783 U | * | 7/2020 |
| CN | 116896361 A | * | 10/2023 |
| CN | 220273658 U | * | 12/2023 |
| DE | 102022208528 A1 | * | 2/2024 |

OTHER PUBLICATIONS

Yu Ren: Title: A single gate driver based solid-state circuit breaker using series connected Sic Mosfets; IEEE transaction on power electronics vol. 34, No. 3, Mar. 2019 (Year: 2019).*

Y. Ren et al., "A Compact Gate Control and Voltage-Balancing Circuit for Series-Connected SiC MOSFETs and Its Application in a DC Breaker," in IEEE Transactions on Industrial Electronics, vol. 64, No. 10, pp. 8299-8309, Oct. 2017.

Y. Ren, X. Yang, F. Zhang, F. Wang, L. M. Tolbert and Y. Pei, "A Single Gate Driver Based Solid-State Circuit Breaker Using Series Connected SiC MOSFETs," in IEEE Transactions on Power Electronics, vol. 34, No. 3, pp. 2002-2006, Mar. 2019.

* cited by examiner

SINGLE PASSIVE GATE-DRIVER FOR SERIES CONNECTED POWER DEVICES IN DC CIRCUIT BREAKER APPLICATIONS

CROSS-REFERENCE TO RELATED APPLICATION

This application claims the benefit of and priority to U.S. Provisional Patent Application No. 63/231,329, filed Aug. 10, 2021, entitled "SINGLE PASSIVE GATE-DRIVER FOR SERIES CONNECTED POWER DEVICES IN DC CIRCUIT BREAKER APPLICATIONS," the contents of which is hereby incorporated herein by reference in its entirety.

STATEMENT REGARDING FEDERALLY SPONSORED RESEARCH OR DEVELOPMENT

This invention was made with government support under grant number DE-AR0001111, awarded by the Advanced Research Projects Agency-Energy (ARPA-E). The government has certain rights in the invention.

BACKGROUND

Direct current (DC) distribution networks offer numerous advantages over alternating current (AC) counterparts as they provide higher efficiency, lower reactive power demand, better stability, and easier integration. DC circuit breakers (DCCB) are often employed in DC distribution networks to clear short circuit faults. However, the behavior of AC mechanical switches is generally desired due to low system impedance and the lack of zero crossing points. Thus, alternative solutions are being explored.

Compared to an AC mechanical switch, several types of power devices have various advantages, such as arcless openings, faster turn-off speeds, and the like. Different power semiconductor technologies, such as silicon (Si), silicon carbide (SiC), and gallium nitride (GaN) semiconductor devices have been applied to SSCBs. Silicon bipolar devices, for example, provide good over-current and short-circuit capabilities, whereas silicon carbide devices operate at higher temperatures and voltages, and provide lower conduction losses per die area. However, blocking voltages of various types of power devices do not meet specifications desired for several types of implementations.

BRIEF SUMMARY

Various embodiments are disclosed herein for single gate-driver circuits having series-connected power devices for use in DC circuit breaker and similar applications. In a first aspect, a solid-state circuit breaker (SSCB) is disclosed that includes a first insulated gate bipolar transistor (IGBT) and a second IGBT being connected in series. A gate of the first IGBT is connected to a first gate resistor and a gate of the second IGBT is connected to a second gate resistor. The SSCB further includes a first diode connected to the first gate resistor and the second gate resistor, one or more resistor-capacitor (RC) snubber circuits connected in parallel to one or more of the first IGBT and the second IGBT, one or more metal-oxide varistors (MOVs) connected in parallel to at least one of the first IGBT and the second IGBT, and a gate driver connected to the first diode and an emitter of at least one of the first IGBT and the second IGBT.

In some embodiments, the SSCB further includes a third IGBT being connected in series with the first IGBT and the second IGBT, the third IGBT being connected to a third gate resistor, and a second diode connected between the second gate resistor and the third gate resistor. The one or more MOVs may include, for example, a first MOV connected in parallel with the first IGBT, a second MOV connected in parallel with the second IGBT, and a third MOV connected in parallel with the third IGBT.

In some aspects, the DCCB may include a first gate emitter diode and a first gate emitter capacitor connected to a gate and an emitter of the second IGBT, and a second gate emitter diode and a second gate emitter capacitor connected to a gate and an emitter of the third IGBT. The one or more RC snubber circuits may include a first RC snubber circuit connected in parallel to the first IGBT, a second RC snubber circuit connected in parallel to the second IGBT, and a third RC snubber circuit connected in parallel to the third IGBT. The first RC snubber circuit may include, for example, a first snubber circuit resistor and a first snubber circuit capacitor, the second RC snubber circuit may include a second snubber circuit resistor and a second snubber circuit capacitor, and the third RC snubber circuit may include a third snubber circuit resistor and a third snubber circuit capacitor.

In some aspects, the one or more MOVs may be a single MOV connected in parallel to an emitter of the first IGBT and a collector of the third IGBT. The one or more RC snubber circuits may be a single RC snubber circuit connected in parallel to the emitter of the first IGBT and the collector of the third IGBT. In various embodiments, the SCCB may further include a first transient-voltage-suppression diode in parallel with a first resistor, each being connected to a gate of the second IGBT, and a second transient-voltage-suppression diode in parallel with a second resistor, each being connected to a gate of the third IGBT. The single MOV may be a high-voltage MOV, for example.

In a second aspect, a method is described that includes providing a circuit breaker, comprising: a first transistor and a second transistor being connected in series, a gate of the first transistor being connected to a first gate resistor and a gate of the second transistor being connected to a second gate resistor; a first diode connected to the first gate resistor and the second gate resistor; one or more RC snubber circuits connected in parallel to at least one of the first transistor and the second transistor; one or more metal-oxide varistors (MOVs) connected in parallel to at least one of the first transistor and the second transistor; and a gate driver connected to the first diode and an emitter of at least one of the first transistor and the second transistor. The method may further include driving the circuit breaker using the gate driver.

BRIEF DESCRIPTION OF THE DRAWINGS

For a more complete understanding of the embodiments and the advantages thereof, reference is now made to the following description, in conjunction with the accompanying figures briefly described as follows.

DETAILED DESCRIPTION

The present disclosure relates to single passive gate-driver implementations for series-connected power devices in DC circuit breaker applications. DC circuit breakers (DCCBs) are employed in DC distribution systems to protect against should circuit faults. In turn, series power device stacks are employed in solid-state circuit breaker (SSCB) to meet clamping voltage requirements. Among different gate driver implementations, circuit architectures that implement a single gate driver are cost-effective, provide simpler circuitry, and are thus more easily manufactured and implemented. Accordingly, various embodiments are described herein for passive gate drive solutions for series-connected power devices, which may be implemented in DC circuit breaker, SSCB, and hybrid circuit breaker (HCB) applications, among others.

In the context outlined above, gate control of power semiconductor devices using reduced gate drivers is disclosed. A circuit breaker may include a multitude of transistors, such as insulated gate bipolar transistors (IGBTs), connected in series with one another. Each transistor may be connected to a respective gate resistor. Diodes may be connected between various gate resistors. One or more resistor-capacitor (RC) snubber circuits may be provided in parallel with one or more of the transistors. Likewise, one or more metal-oxide varistors (MOVs) may be connected in parallel to one or more of the transistors. A gate driver may be connected to the one or more diodes and an emitter of at least one of transistors.

Figure 1A:
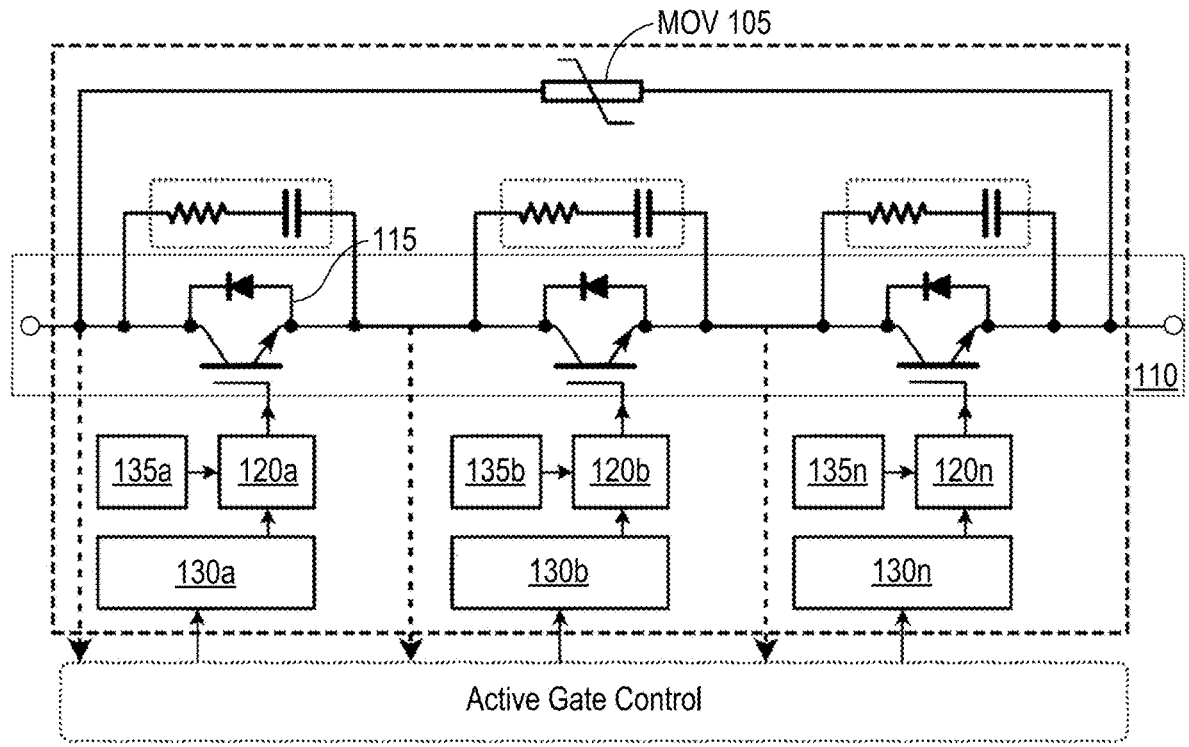
FIGS. 1A and 1B illustrate conventional SSCB structures that use three IGBTs connected in series.
Figure 1B:
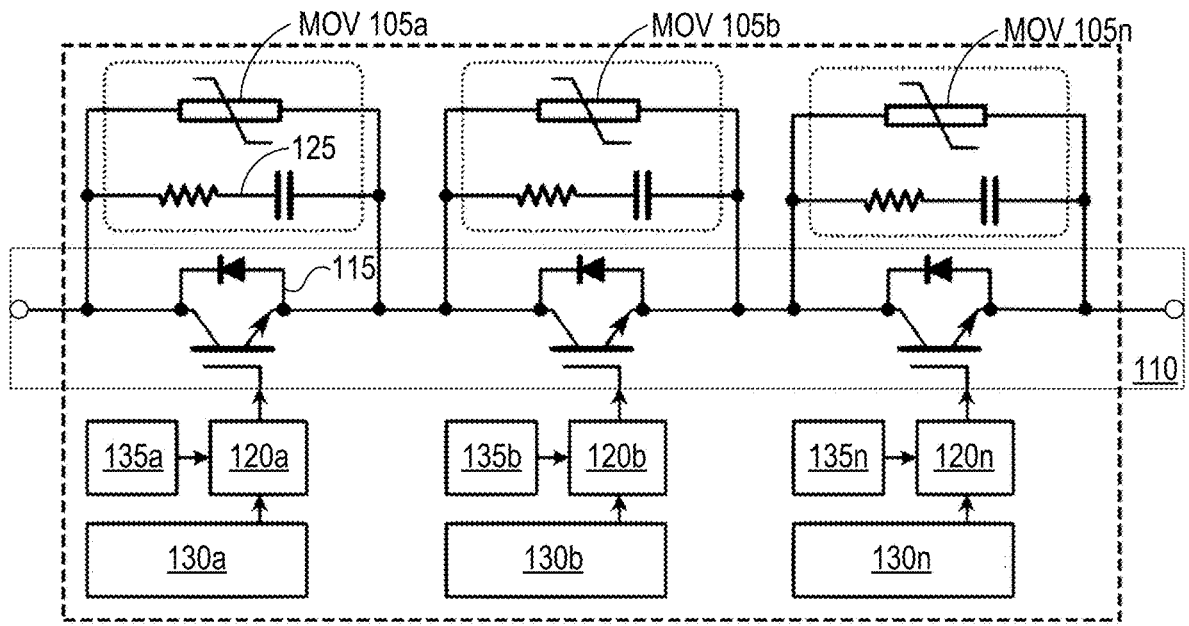

Turning now to the drawings, FIGS. 1A and 1B illustrate conventional solid-state circuit breaker (SSCB) circuits 100a, 100b, respectively, according to the related art. Specifically, in FIG. 1A, a concentrated metal oxide varistor (MOV) 105 is connected in parallel with a series power device stack 110 to limit overvoltage and absorb energy. The series power device stack includes a plurality of insulated gate bipolar transistor (IGBTs) 115. Notably, as shown in FIG. 1A, a gate driver 120 is required for each IGBT 115. In other words, there is a one-to-one correspondence between a gate driver 120 and an IGBT 115.

As the MOV 105 provides voltage clamping functionality, a solution based on discrete MOVs 105a . . . 105n (collectively "MOVs 105") is shown in FIG. 1B. In this case, resistor-capacitor (RC) snubber circuits 125 are employed to lower switching losses and suppress voltage spikes of a respective one of the MOVs 105. Compared to the circuit of FIG. 1A, the circuit shown in FIG. 1B tends to have better modularity and scalability while avoiding cascading damage. However, both circuits require an individual gate driver 120, a fiber-optic device 130, and an isolated power supply 135 for each device (e.g., IGBT 115) in the series power device stack 110, which increases cost, reduces reliability, and is inoperable in harsh environments. In other words, there is a one-to-one correspondence between a device (e.g., the IGBT 115) and a gate driver 120, a fiber-optic device 130, and an isolated power supply 135.

As such, for each device (e.g., IGBT 115) utilized in a circuit, a gate driver 120, a fiber-optic device 130, an isolated power supply 135, and supporting circuitry is required. In order to reduce the components number and system complexity, various embodiments for a single gate driver circuit architecture are proposed herein, as will be described.

Figure 2:
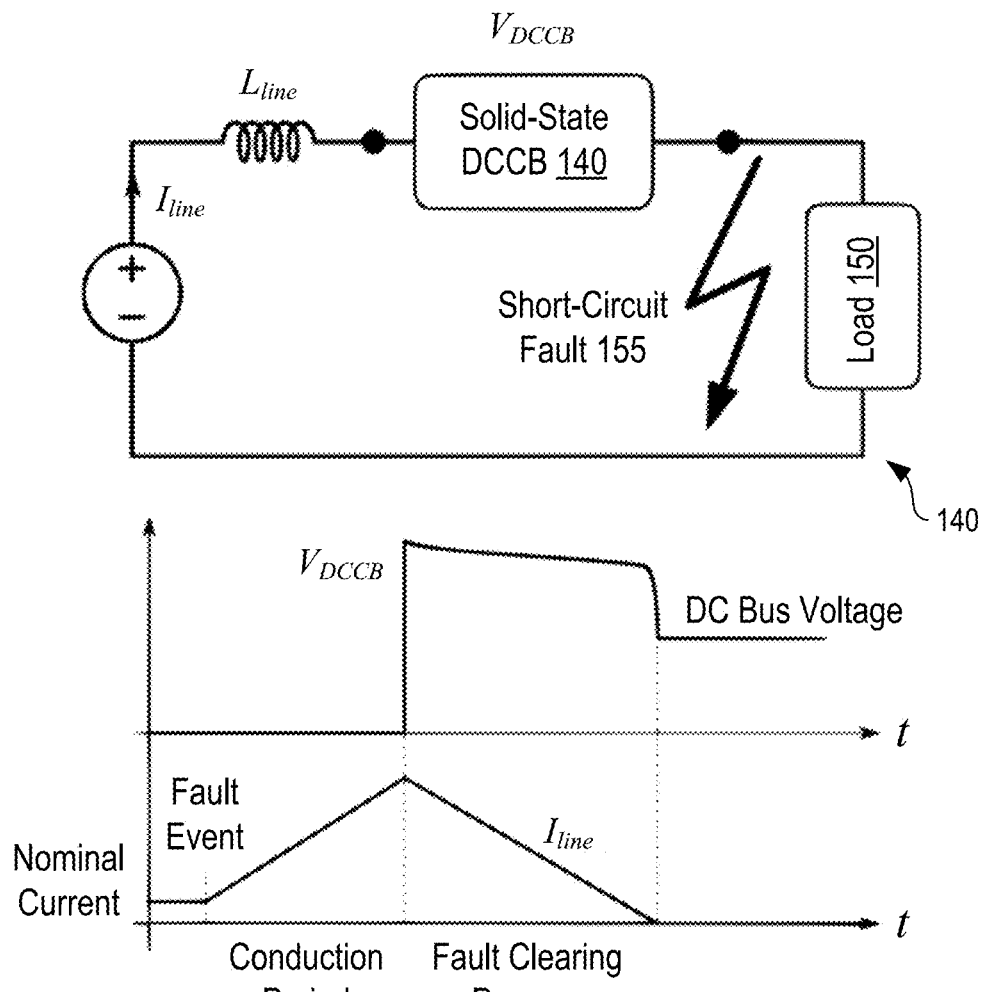
FIG. 2 illustrates a typical waveform of a DC circuit breaker circuit.

Referring now to FIG. 2, typical waveforms of a solid-state DCCB 140 in an example circuit 145. The example circuit 145 includes the solid-state DCCB 140 in series with a load 150. At a normal state, the example circuit 145 is turned on to conduct nominal current. Once a short-circuit fault 155 occurs, line current $I_{line}$ will increase rapidly due to a relatively small line inductance $L_{line}$. After a certain time required for fault detection and system response, the DCCB 140 will begin to clear a peak fault current by generating a clamping voltage higher than the DC-bus voltage. The short-circuit energy is absorbed by the MOV 105, such as the MOVs 105 of FIGS. 1A and 1B, and the fault current drops to zero. Thereafter, a snubber circuit (if any) paralleled with the MOV 105 will resonate with the line inductance $L_{line}$, and the voltage decays until the DC-bus voltage $V_{dc}$ is reached. This process is referred to as a "voltage recovery process."

To address limitations of conventional power semiconductor devices and the demand of increasing DC bus voltages, series connected power devices are proposed according to various embodiments of the present disclosure. Voltage balancing across series devices may be a challenging issue, but various techniques such as passive snubber, active gate control, and active clamping circuits are proposed herein to mitigate voltage balancing issues. For various DCCB applications, the function of the MOVs 105 can overlap with the voltage-balancing design, so it may be paralleled with each device to limit the voltage.

Figure 3:
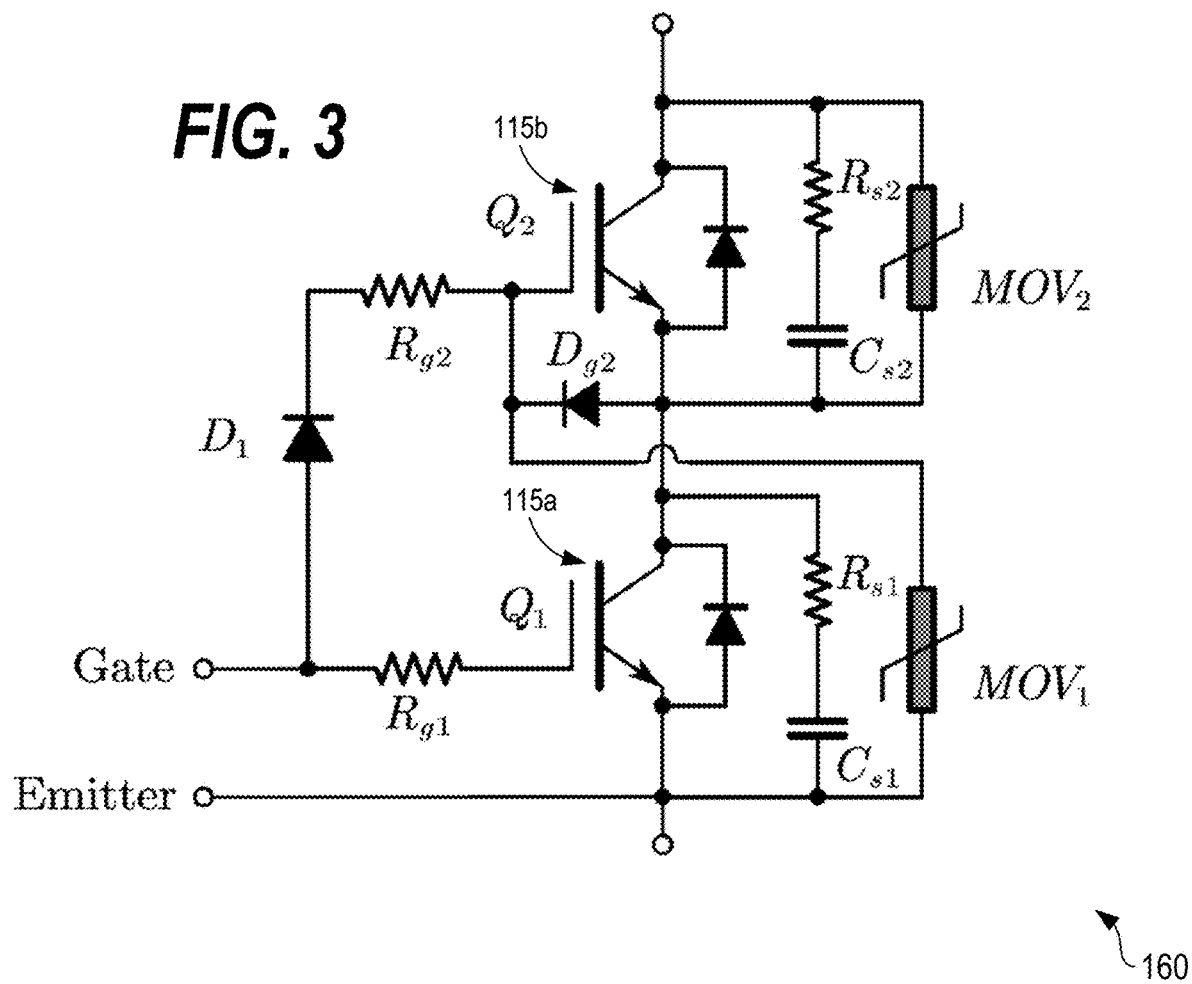
FIG. 3 illustrates a series of two IGBTs with a single gate driver circuit according to various embodiments of the present disclosure.
Figure 4:
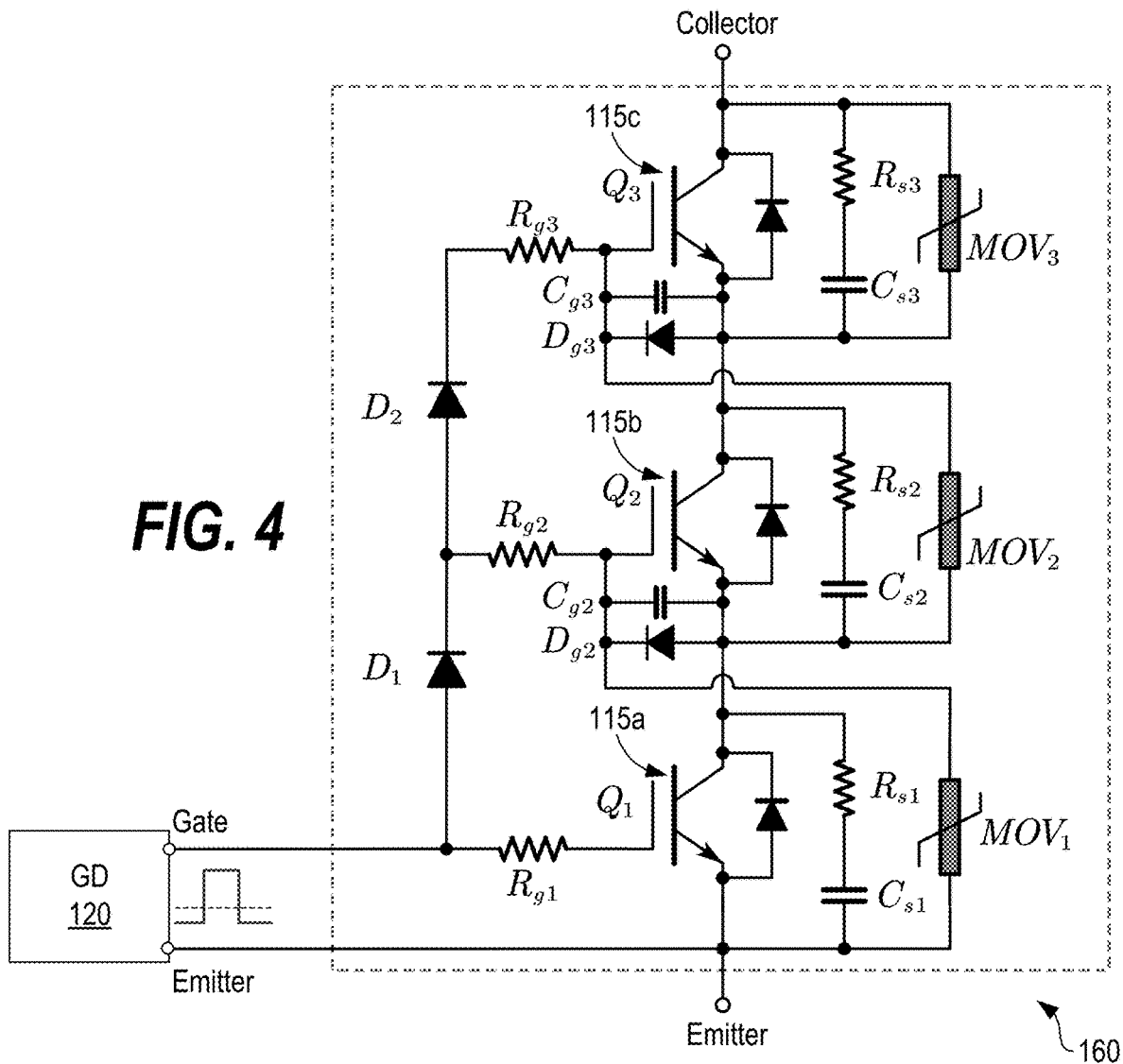
FIG. 4 illustrates a series of three IGBTs with a single gate driver circuit according to various embodiments of the present disclosure.
Figure 5:
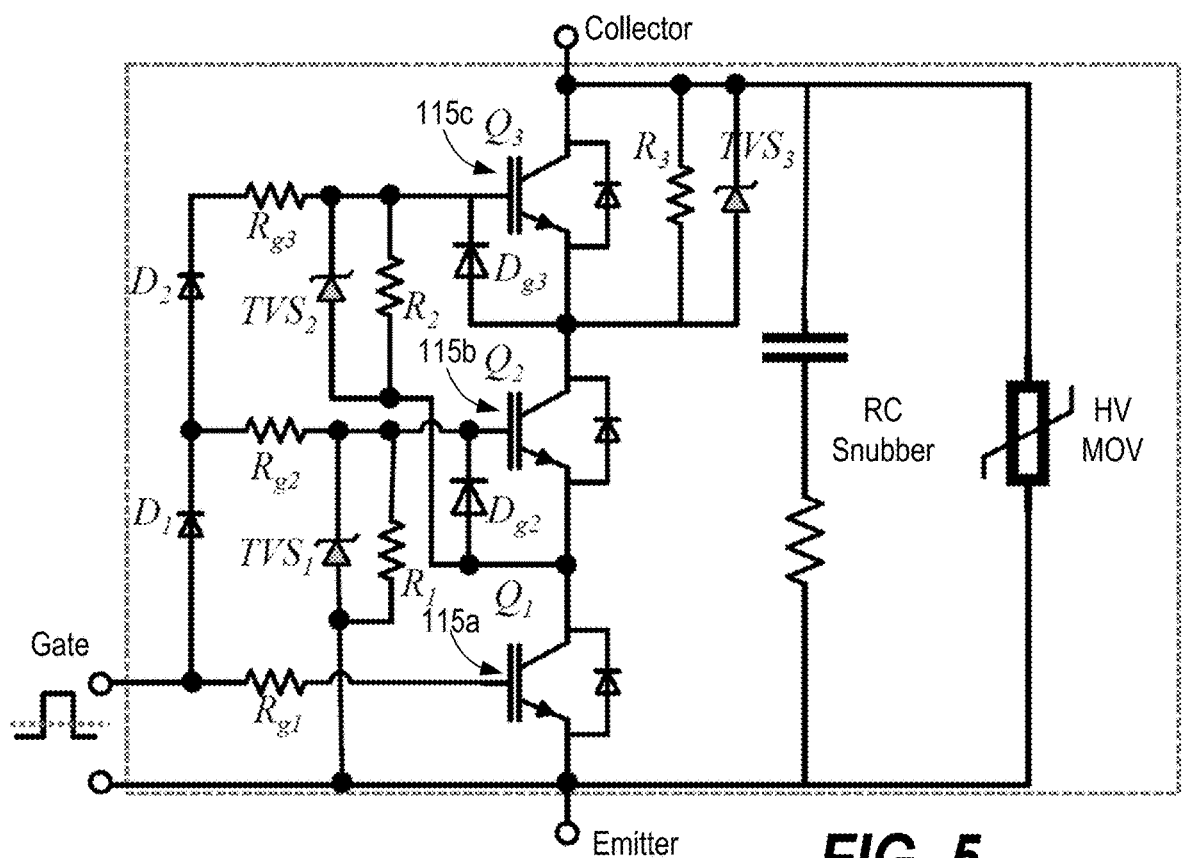
FIG. 5 illustrates a series of three IGBTs with a single gate driver circuit according to various embodiments of the present disclosure.

Accordingly, various examples of a circuit 160 for implementing a solid-state circuit breaker in accordance with the various embodiments described herein are shown in FIG. 3, FIG. 4, and FIG. 5. First, with respect to FIG. 3, the circuit 160 includes a series power device stack 110 comprising a series of two IGBTs 115. The circuit 160 includes a gate input to which a single gate driver 120 may be directly or indirectly coupled. In the circuit 160 of FIG. 1, the circuit 160 includes two gate resistors $R_{g1}$, $R_{g2}$, a diode D, and MOVs MOV$_1$, MOV$_2$, Diode D$_1$ may include a high-voltage diode, for example, that provides a current path for a turn-on voltage.

In the non-limiting example of FIG. 3, the MOV MOV$_1$ may be connected between a gate of an upper IGBT 115 and an emitter of a bottom IGBT 115, so that a MOV current is operable to discharge a respective gate capacitor. The MOV MOV$_2$ is placed across a connector and an emitter of the top-most transistor Q$_2$ 115 directly. A snubber capacitor and a snubber resistor are paralleled with each IGBT 115, which reduces device stress and improves MOV steep front effect. Gate-emitter diode D$_{g2}$ may include a low-voltage gate-emitter diode that generates negative voltage to turn off a respective IGBT 115. Due to the good scalability, more devices can be connected in series easily using the same structure.

To this end, a circuit 160 for implementing a solid-state circuit breaker is shown in FIG. 4 as having a series power device stack 110 formed of a series of three IGBTs 115 with a single gate driver 120. Initially, the circuit 160 includes three gate resistors R$_{g1}$, R$_{g2}$, and R$_{g3}$, diodes D$_1$, D$_2$, and MOVs MOV$_1$, MOV$_2$, and MOV$_3$. Diodes D$_1$, D$_2$ may include high-voltage diodes that provide a current path for a turn-on voltage, for example.

The MOVs MOV$_1$ and MOV$_2$ are connected between a gate of an upper IGBT 110 an emitter of a bottom IGBT 115 so that MOV current is operable to discharge a respective gate capacitor C$_{g1}$, C$_{g2}$, and C$_{g3}$. The MOV MOV$_3$ is positioned across a collector and an emitter of the top-most third IGBT 115c Q$_3$ directly. Snubber capacitors C$_{s1}$, C$_{s2}$, and C$_{s2}$ and snubber resistors R$_{s1}$, R$_{s2}$, and R$_{s3}$ are paralleled with each IGBT 115 (or other transistor), which is operable to reduce device stress and improve a MOV steep-front effect. Gate-emitter diodes D$_{g2}$ and D$_{g3}$ (e.g., low voltage gate-emitter diodes) are operable to generate negative voltage to turn off a respective transistor. Capacitors C$_{g1}$, C$_{g2}$, and C$_{g3}$ (e.g., low-value capacitors) may also be paralleled with a respective gate-emitter diode to suppress the gate oscillation during the voltage recovery process, as will be discussed. Due to scalability of the described circuit, it is understood that more devices (e.g., four or more) can be connected in series easily using the same structures described above.

Referring to FIGS. 3 and 4 collectively, the circuits 160 may include a first IGBT 115a and a second IGBT 115b being connected in series. A gate of the first IGBT 115 may be connected to a first gate resistor R$_{g1}$ and a gate of the second IGBT 115b may be connected to a second gate resistor R$_{g2}$. A first diode D$_1$ may be connected to the first gate resistor R$_{g1}$ and the second gate resistor R$_{g2}$, as shown in FIGS. 3 and 4.

At least one RC snubber circuit may be connected in parallel to at least one of the first IGBT 115a and the second IGBT 115b. For instance, a first RC snubber circuit may include a first snubber resistor R$_{s1}$ and a first snubber capacitor C$_{s1}$, a second RC snubber circuit may include a second snubber resistor R$_{s2}$ and a second snubber capacitor C$_{s1}$, and so forth. In some implementations, a number of the RC snubber circuits may be equal to a number of devices (e.g., IGBTs 115) in the circuit 160.

Further, the circuit 160 may include at least one MOV 105, which may be connected in parallel to at least one of the first IGBT 115a and the second IGBT 115b. A gate driver 120 may be connected to the first diode D$_1$ and an emitter of at least one of the first IGBT 115a and the second IGBT 115b. Referring specifically to FIG. 4, a third IGBT 115b may be connected in series with the first IGBT 115a and the second IGBT 115b. Similar to the first IGBT 115a and the second IGBT 115b, the third IGBT 115c may be connected to a third gate resistor R$_{g3}$. Further, a second diode D$_2$ may be connected between the second gate resistor R$_{g2}$ and the third gate resistor R$_{g3}$.

Specifically, in FIG. 3 in which the circuit 160 includes two IGBTs 115, a first MOV MOV$_1$ may be connected in parallel with the first IGBT 115a, a second MOV MOV$_2$ may be connected in parallel with the second IGBT 115b, and so forth. Specifically, in FIG. 4 in which the circuit 160 includes three IGBTs 115, a first MOV MOV$_1$ may be connected in parallel with the first IGBT 115a, a second MOV MOV$_2$ may be connected in parallel with the second IGBT 115b, a third MOV MOV$_3$ may be connected in parallel with the third IGBT, and so forth.

As shown in FIG. 4, the circuit 160 may include a first gate emitter diode D$_{g1}$ and a first gate emitter capacitor C$_{g1}$ connected to a gate and an emitter of the second IGBT 115b, as well as a second gate emitter diode D$_{g2}$ and a second gate emitter capacitor C$_{g2}$ connected to a gate and an emitter of the third IGBT 115c.

In some embodiments, the at least one RC snubber circuit may include a first RC snubber circuit connected in parallel to the first IGBT 115a, a second RC snubber circuit connected in parallel to the second IGBT 115b, and a third RC snubber circuit connected in parallel to the third IGBT 115c. To this end, the first RC snubber circuit may include a first snubber circuit resistor R$_{s1}$ and a first snubber circuit capacitor C$_{s1}$, the second RC snubber circuit may include a second snubber circuit resistor R$_{s2}$ and a second snubber circuit capacitor C$_{s2}$, and the third RC snubber circuit may include a third snubber circuit resistor R$_{s3}$ and a third snubber circuit capacitor C$_{s3}$.

In various embodiments, as shown in FIG. 5, the at least one MOV may be a single MOV connected in parallel to an emitter of the first IGBT 115a and a collector of the third IGBT 115c, for example. The single MOV may include a high-voltage MOV, as may be appreciated. Similarly, the at least one RC snubber circuit as a single RC snubber circuit that may be connected in parallel to an emitter of the first IGBT 115a and a collector of the third IGBT 115c, for instance.

Further, as shown in the circuit 160 of FIG. 5, the circuit 160 includes a first transient-voltage-suppression diode TVS$_1$ in parallel with a first resistor RI, each being connected to a gate of the second IGBT 115b, as well as a second transient-voltage-suppression diode TVS$_2$ in parallel with a second resistor, each being connected to a gate of the third IGBT 115c.

Figure 6:
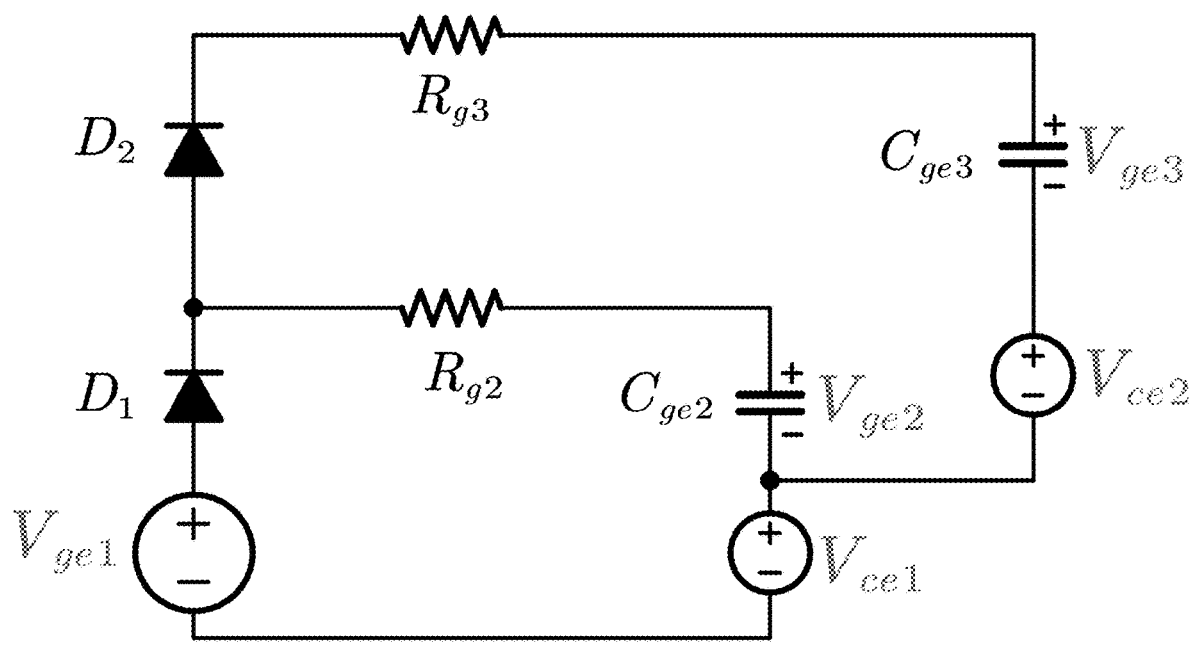
FIG. 6 illustrates an equivalent on-state and gate driver circuit for the series of three IGBTs shown in FIGS. 4 and 5 according to various embodiment of the present disclosure.

The high-voltage diodes D$_1$ and D$_2$ may assure a reliable positive gate voltage of upper IGBT Q$_2$ 115b and upper IGBT Q$_3$ 115c in the circuit 160. Specifically, the high-voltage diodes D$_1$ and D$_2$ may create the gate current for IGBT Q$_2$ 115b and IGBT Q$_3$ 115c from the standard gate driver 120. An equivalent driver circuit is shown of the circuit 160 of FIG. 4 for example is shown in FIG. 6. The gate voltages are expressed as:

$$V_{ge2} = V_{ge1} - V_{D1} - V_{ce1}$$

$$V_{ge3} = V_{ge1} - V_{D1} - V_{D2} - V_{ce1} - V_{ce2} \quad \text{(eq. 1)},$$

where V$_{ce1}$ and V$_{ce2}$ are the voltage drop of IGBT Q$_1$ 115a and IGBT Q$_2$ 115b, respectively, while V$_{D1}$ and V$_{D2}$ are the voltage across diodes D$_1$ and D$_2$.

The turn on process starts when a positive gate signal is applied to the gate of IGBT Q$_1$ 115a to turn it on. Then, the gate capacitor of IGBT Q$_2$ 115b is charged through diode D$_1$, resistor $R_{g2}$, and IGBT $Q_1$ 115a. Once $V_{ge2}$ reaches a threshold voltage, IGBT $Q_2$ 115b is turned on, and then IGBT $Q_3$ 115c is also turned on in the same fashion. It should be noted that $V_{ce1}$ and $V_{ce1}$ are related to the surge current. For instance, when the current rises, the gate-emitter voltage of upper IGBTs 115 will reduce a little. Therefore, the upper device has a lower turn-on gate voltage, compared to the lower device. However, so long as the gate voltage is sufficiently high to avoid desaturation at peak currents, the operation of the circuit 160 will not be influenced. Moreover, additional solutions may be employed to avoid limitations in gate voltage. For example, the turn-on voltage of gate driver output may be increased while adding diodes (e.g., Zener diodes) to compensate for a voltage drop. The additional diodes could be low-voltage diodes with a small footprint, for example. In this regard, the on-state voltage could be equal. In various embodiments, an extra isolated power supply may be provided to boost upper device gate voltages.

Figure 7:
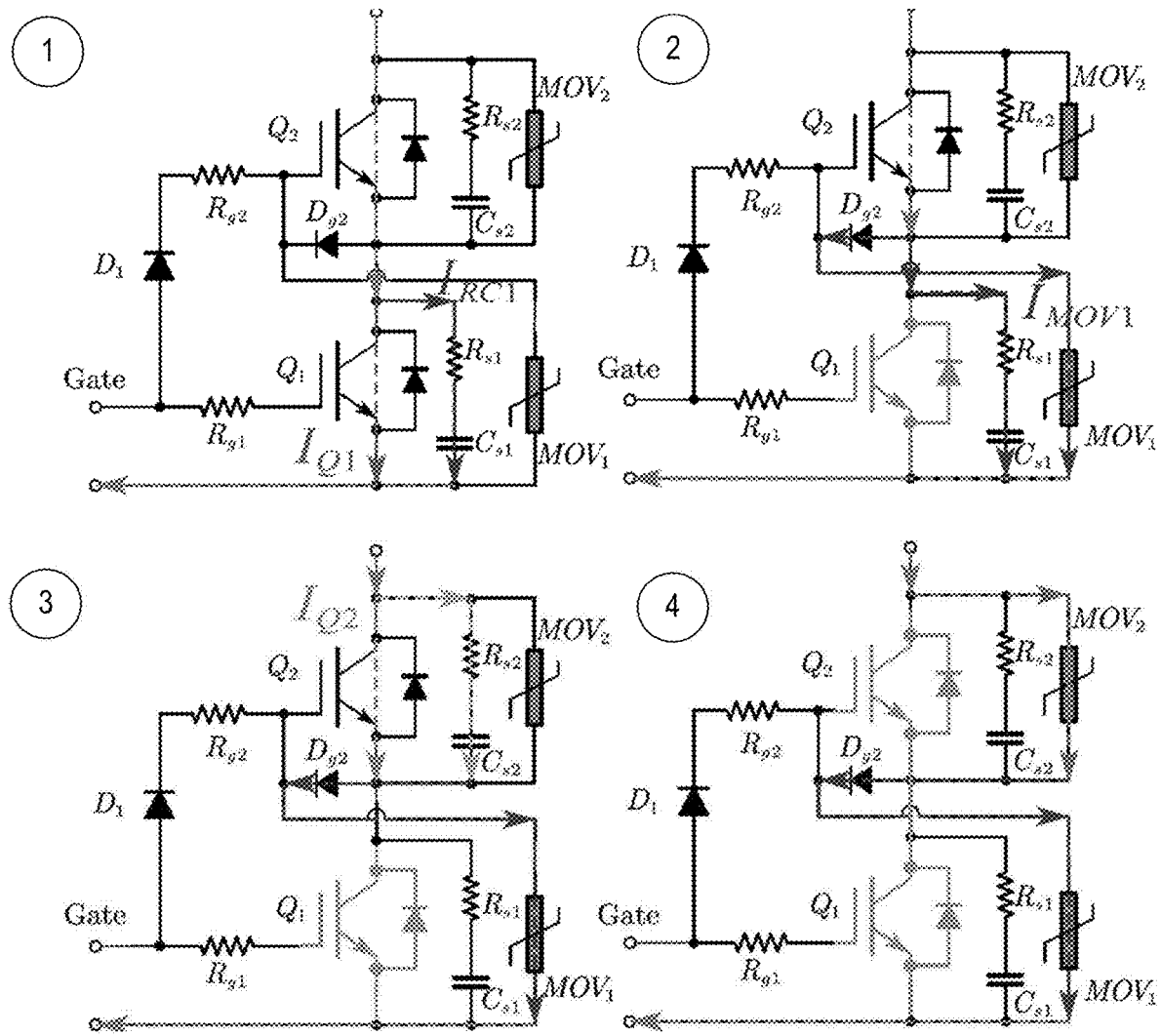
FIG. 7 illustrates a simplified series of two IGBTs showing a turn-off transition divided into four stages according to one embodiment of the present disclosure.
Figure 8:
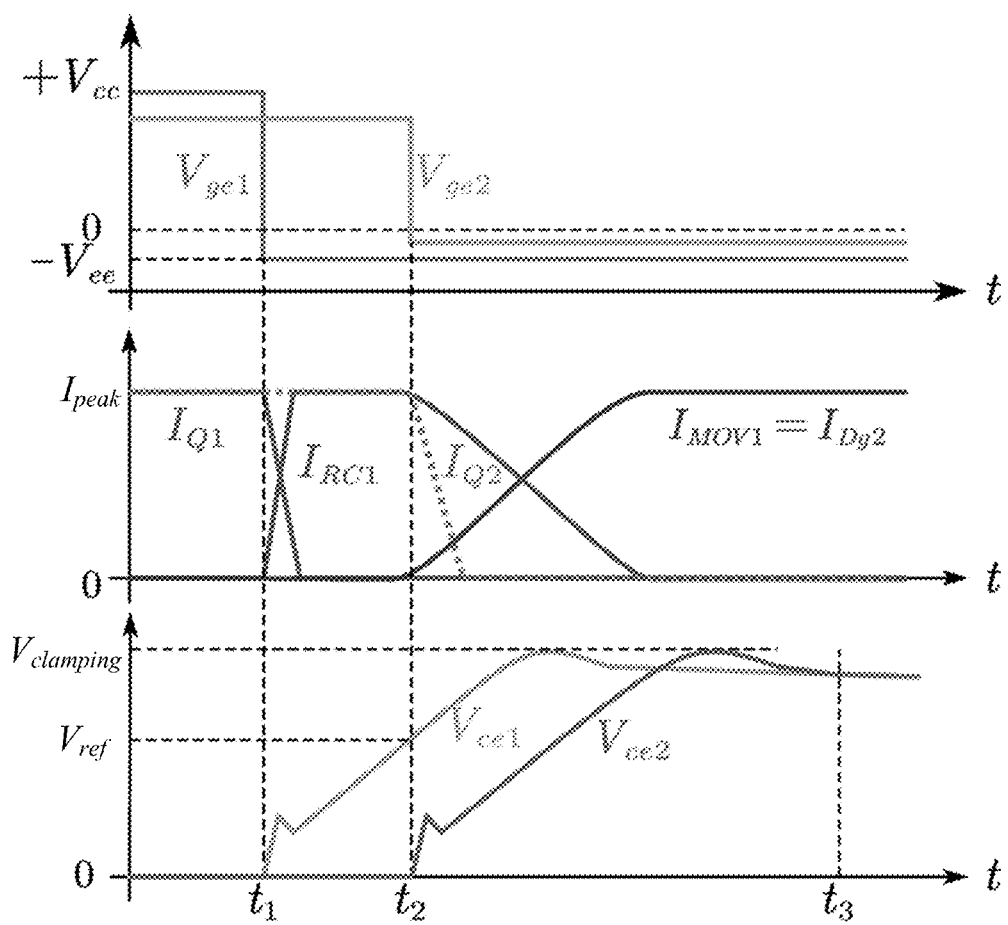
FIG. 8 illustrates corresponding transition waveforms of the four stages of the turn-off transition shown in FIG. 7.

For purposes of explanation, an example of two-series IGBTs 115a, 115b are employed to illustrate a turn-off transition, which can be divided into four stages as shown in FIG. 7. Corresponding transition waveforms are depicted in FIG. 8. At t1, a negative voltage is applied to IGBT $Q_1$ 115a. Then, $C_{ge}$ of IGBT $Q_1$ 115a begins to discharge, so the IGBT current $I_{Q1}$ reduces and is commutated to the RC snubber branch of the circuit 160. There is a voltage spike at the end of the current commutation due to the parasitic inductance in the loop. When the snubber voltage is charged by $I_{RC1}$ and reaches the reference voltage of the MOV at t2, the impedance of the MOV will drop quickly. As such, the current will start to flow through the gate diode $D_{g2}$ and the $MOV_1$ branch of the circuit. Once there is current through diode $D_{g2}$, the gate-emitter capacitor of IGBT $Q_2$ 115b will be discharged, and $V_{ge2}$ will drop to a negative value. This value is the forward voltage drop of diode $D_{g2}$ at the peak fault current $I_{peak}$. After IGBT $Q_2$ 115b is turned off, the current $I_{Q2}$ will be commutated to the snubber branch and next the $MOV_2$ branch with a similar time sequence. As such, the voltage waveform is the same except for some delay, which is related to the snubber branch value:

$$V_{ref}=R_s I_{peak}+I_{peak}(t_2-t_1)/C_s \quad \text{(eq. 2)}.$$

The peak value is determined by the clamping voltage of the MOV at $I_{peak}$. Finally, at t3, it can be seen that two IGBT voltages overlap, indicating that voltage balance is realized.

Figure 9:
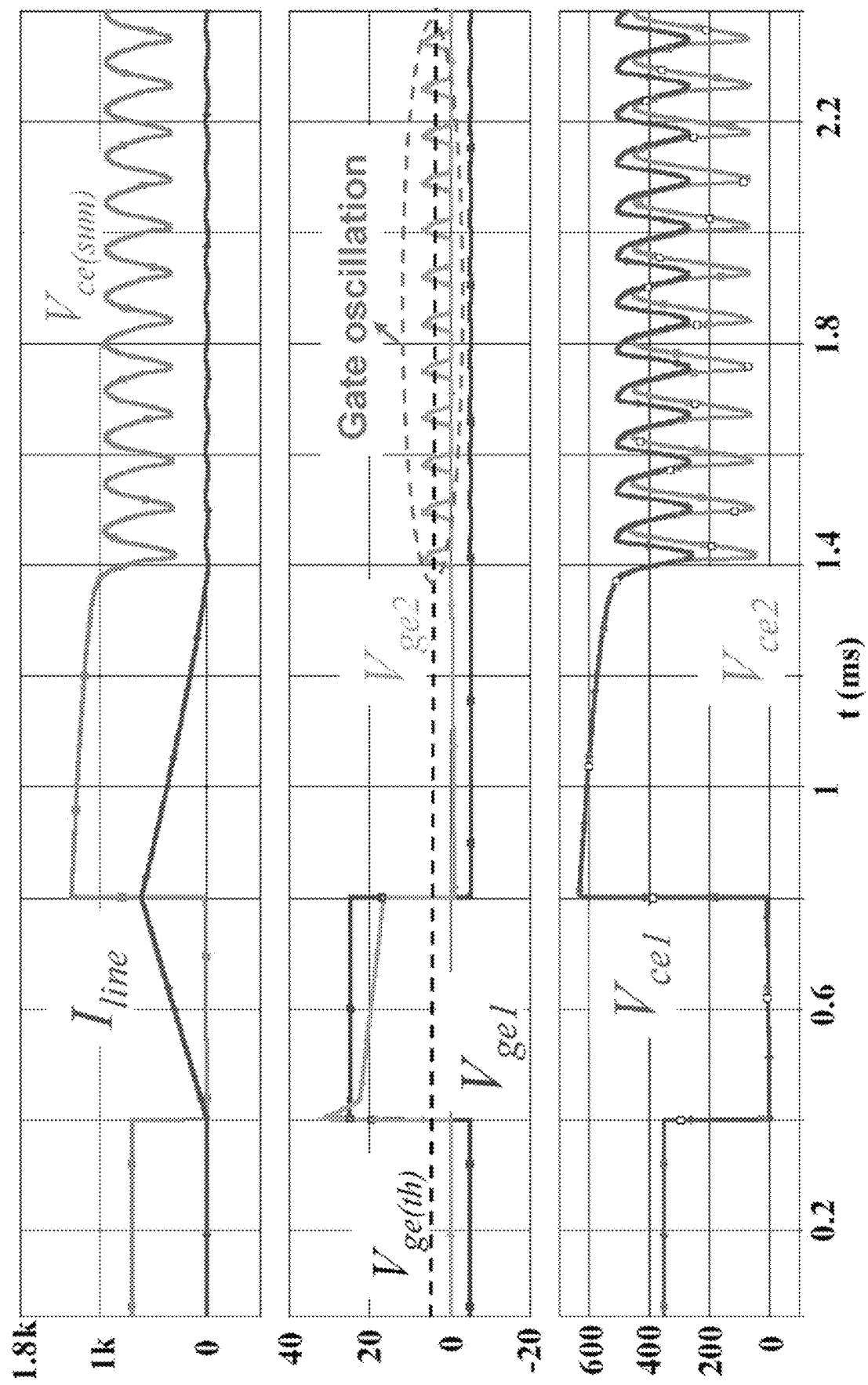
FIG. 9 illustrates simulation waveforms including a gate oscillation phenomenon without a gate capacitor generated in accordance with various embodiments described herein.

In order to verify effectiveness of the various embodiments of the present disclosure, various simulations were performed. In a simulation performed programmatically, a DC-bus voltage was set as 700 V and a line inductance was set as 0.45 mH to limit a fault current rise rate. Only the gate diode Dg2 was connected between the gate and emitter of Q2 to highlight gate oscillation phenomenon. The results of the simulation results are shown in FIG. 9. Voltage oscillation can be observed at the gate of IGBT $Q_2$ 115b during the voltage recovery process which causes unbalanced voltage between two transistor devices.

A qualitative analysis is given here to explain this phenomenon. According to the turn-off transition process, the gate voltage $V_{ge2}$ should be zero after the diode current $I_{Dg2}$, which equals to the line current $I_{line}$, reduces to zero. However, the snubber capacitor has a voltage higher than $V_{dc}$, causing the snubber branch to resonate with the line inductor, which introduces sinusoidal line current.

Figure 10:
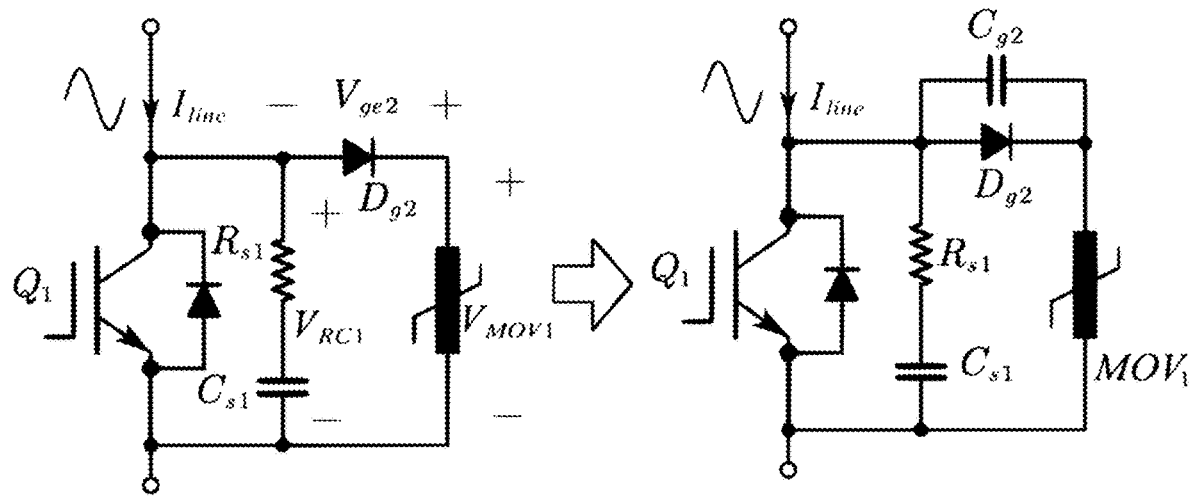
FIG. 10 illustrates a simplified circuit for the analysis of the gate oscillation phenomenon illustrated in FIG. 9 in accordance with various embodiments described herein.
Figure 11:
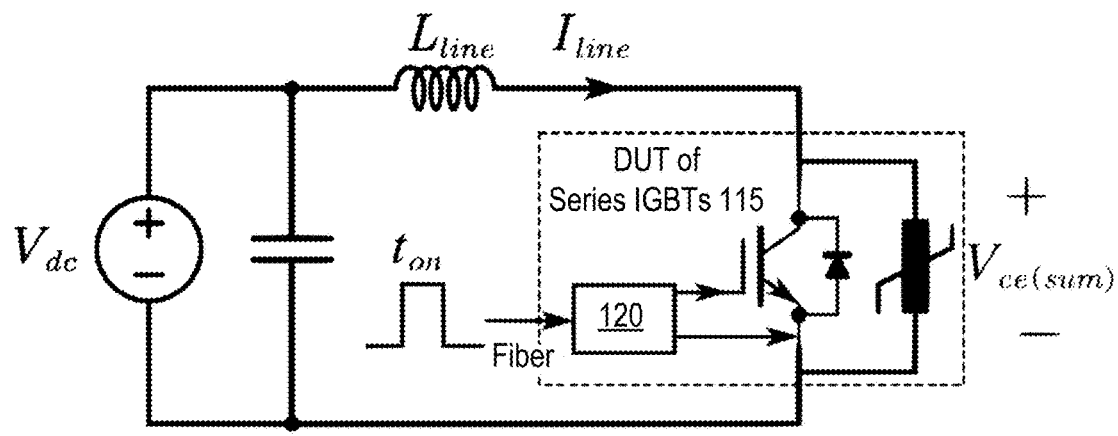
FIG. 11 illustrates a short circuit test setup that experimentally demonstrates feasibility of the single gate driver-based series IGBT circuit according to various embodiments of the present disclosure.

For simplification, only the $D_{g2}$ current path circuit is given in FIG. 10 for illustration. When $I_{line}$ is positive, $D_{g2}$ is in an ON state and $V_{MOV1}$ equals $V_{RC1}$. However, when $I_{line}$ is negative, $D_{g2}$ is in an OFF state, and the voltage difference between the $MOV_1$ and snubber will be applied to $D_{g2}$, which could turn on IGBT $Q_2$ 115b. As such, $V_{ce2}$ drops to a lower value and leads to the unbalanced voltage sharing.

In order to solve this stability phenomenon, an equivalent resistor of the power loop may be increased. The damping circuit comprising a forward diode and a parallel damping resistor may be employed, which suppresses the resonant current in the voltage recovery process. However, this cannot be used in a bidirectional DCCB, and the damping circuit reduces the efficiency at the normal state. In some embodiments, a low-value external gate capacitor may be paralleled with a gate diode to provide a low impedance path for the MOV when $I_{line}$ is negative. This provides a simpler circuit architecture and does not increase conduction loss.

To experimentally demonstrate feasibility of a single gate driver-based series IGBT circuit as described in accordance with various embodiments herein, a simple short-circuit test setup was constructed.

TABLE I

Electrical Parameters of Test Setup

| Parameters | Values | Parameters | Values |
| --- | --- | --- | --- |
| DC Voltage $V_{dc}$ | 0-1 kV | Gate Capacitor $C_g$ | 100 nF |
| Line Inductor $L_{line}$ | 0.45/0.15 mH | Snubber Capacitor $C_s$ | 0.6 μF |
| Gate Diode $D_g$ | 100 V, 50 A | Snubber Resistor $R_s$ | 1 Ω |
| IGBT $Q_1$, $Q_2$, $Q_3$ | 1.7 kV, 100 A | MOV Voltage | 800 V |

Figure 12:
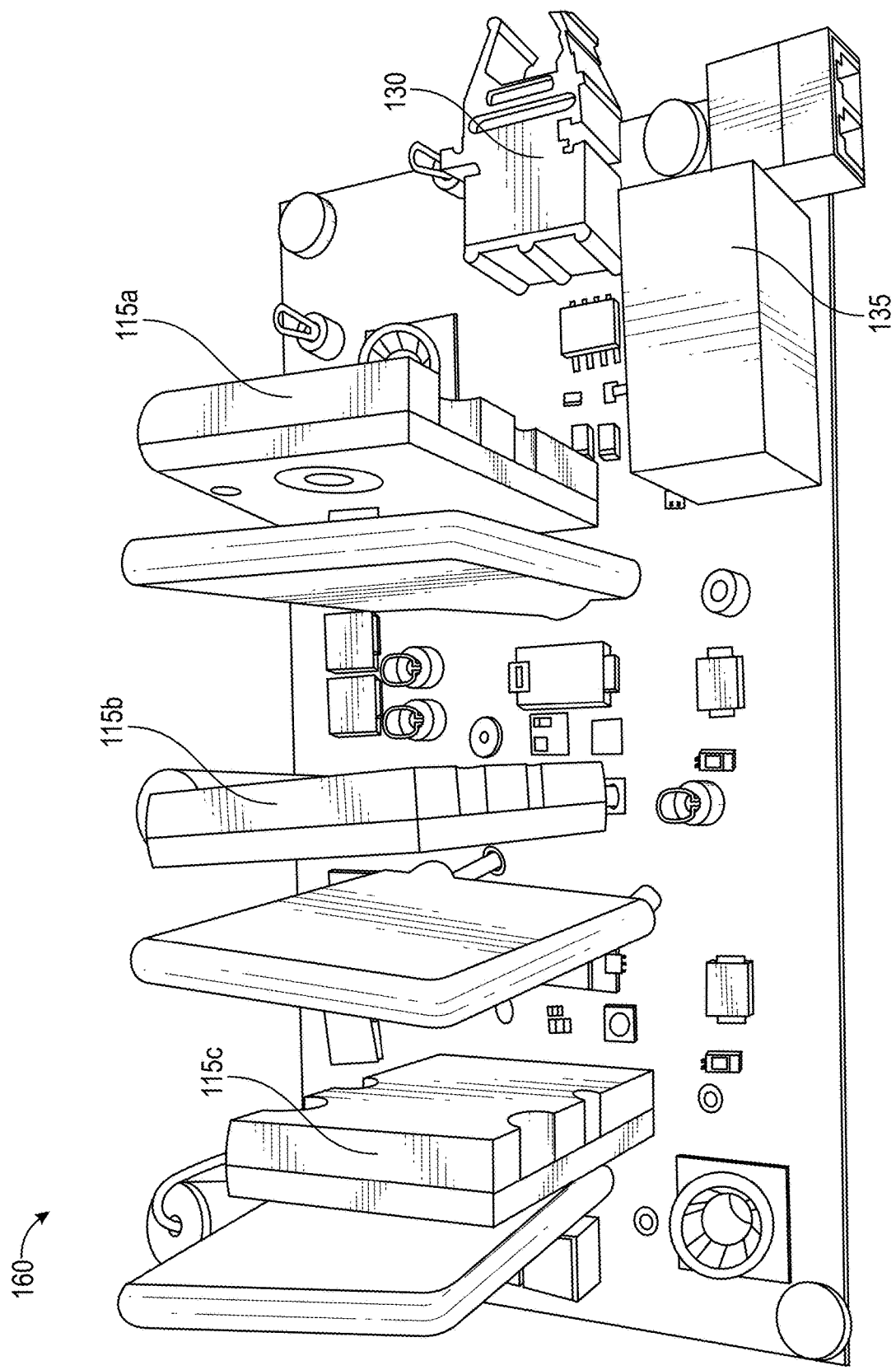
FIG. 12 illustrates a top-down view of a circuit device having a series of three IGBTs with a single gate driver according to various embodiments of the present disclosure.
Figure 13:
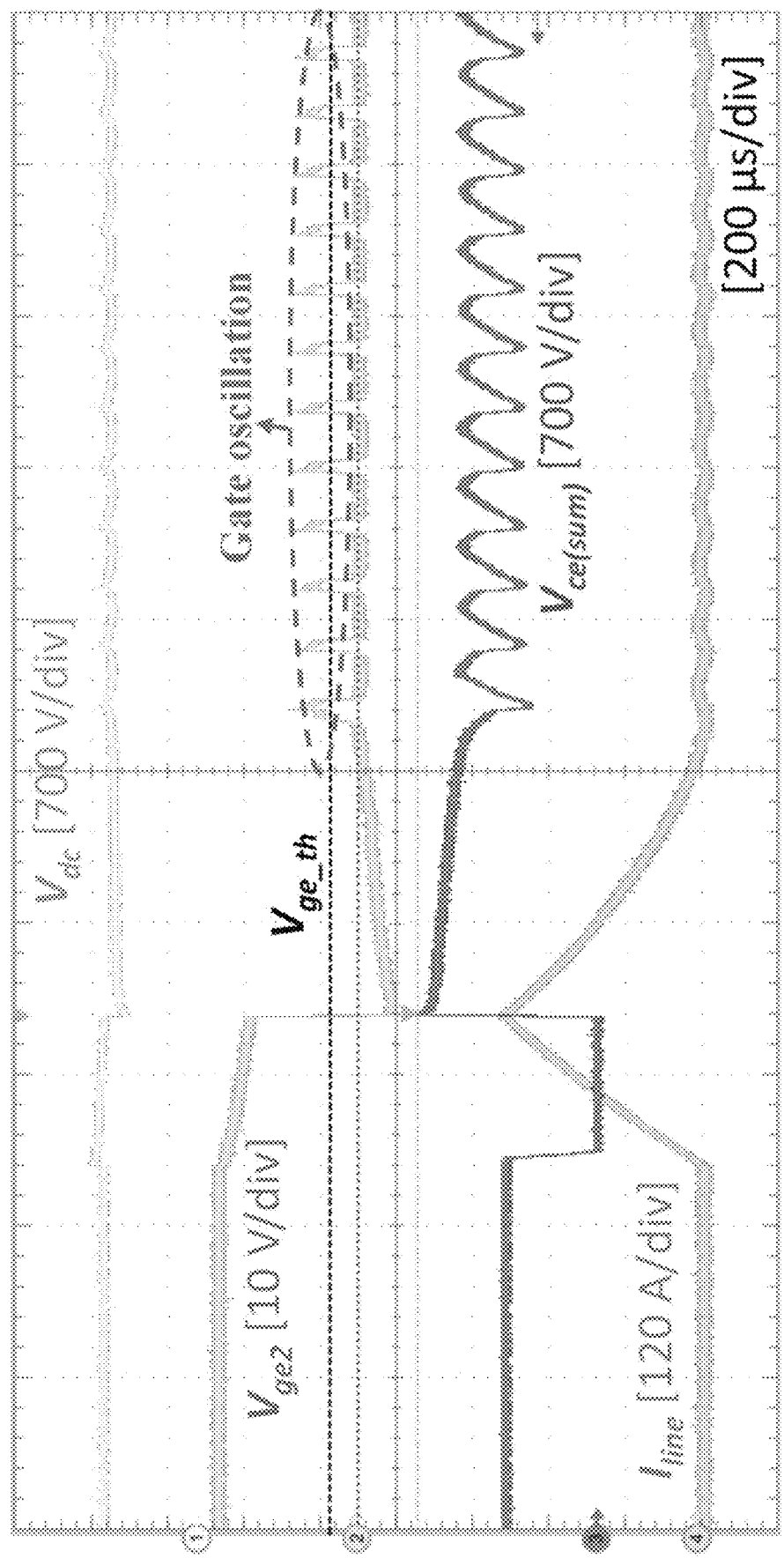
FIG. 13 illustrates waveforms of gate oscillation at voltage recovery processes for two series IGBTs that are connected generated in accordance with various embodiments described herein.

The electrical parameters are listed in Table I and the structure is shown in FIG. 12. The short-circuit current was created by turning on the device under test (DUT), which is shown in FIG. 13. The di/dt is limited by the line air core inductor, and the peak value is controlled by the ON-duration ton. In the first test, only two-series IGBTs 115 are connected to repeat the gate oscillation phenomenon in FIG. 13, and the gate capacitor is not populated. The line inductor is selected as 0.45 mH to match the simulation model. It can be seen that the 240 A peak current is interrupted successfully after 20 μs. However, the top device gate voltage $V_{ge2}$ oscillates, thereby exceeding the device threshold voltage so that IGBT $Q_2$ 115b is turned ON and the resonant process lasts a long time.

Figure 14:
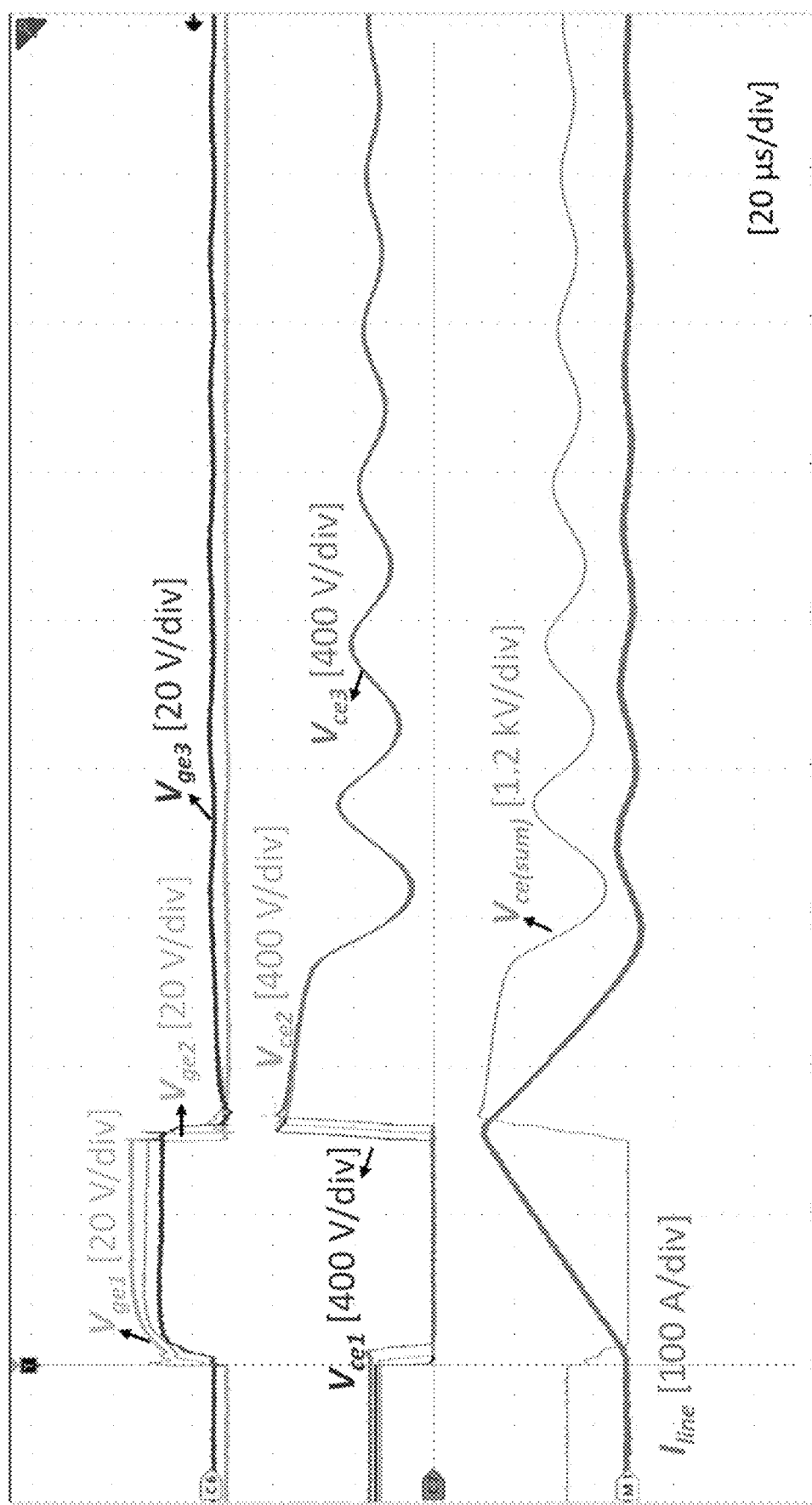
FIG. 14 illustrates experimental waveforms of three series IGBTs with an added gate capacitor generated in accordance with various embodiments described herein.

In the second test as shown in FIG. 14, three IGBTs 115a, 115b, and 115c are connected in series and the additional gate capacitor is added to suppress the oscillation. In this test, the line inductor is selected as 0.15 mH. It can be observed that three devices are turned on and off from bottom to top one by one, which matches the previous transition process analysis. Due to the gate capacitor, the gate-emitter voltage oscillation is mitigated, and the faulty turn-on phenomenon is not observed. Therefore, the voltage sharing of three IGBTs 115 is improved and the resonant process decays quickly.

Accordingly, various embodiments are described herein for a single passive-based gate driver solution for series power devices technology, such as for DC SSCB and hybrid circuit breaker (HCB) applications. Compared with the traditional series devices, the embodiments described herein may eliminate extraneous and unnecessary power supplies, fiber-optics, and gate driver chips, achieving higher power density and lower cost. In addition, complicated tuning process of the capacitor coupling structure are not required. The proposed passive gate driver offers robust and reliable operation in harsh environments, for example, high-temperature down-hole applications. Potential gate oscillation issues are also solved to improve system stability and robustness. Test results from experimental prototypes verify the feasibility and effectiveness of the circuits 160 described herein. With good scalability, a DCCB with higher blocking voltage can be achieved more easily based on the embodiments described herein.

While various embodiments of the circuit 160 described herein include a IGBT 115, it is understood that other similar semiconductor devices may be employed, such as metal-oxide semiconductor field-effect transistors (MOSFETs), and other semiconductor devices and transistors. The semiconductor devices may include silicon (Si), silicon carbide (SiC), and gallium nitride (GaN) devices, among others.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The features, structures, or characteristics described above may be combined in one or more embodiments in any suitable manner, and the features discussed in the various embodiments are interchangeable, if possible. In the following description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" are used in the specification to describe the relative relationship of one component to another component, these terms are used in this specification for convenience only, for example, as a direction in an example shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified in the appended claims.

The terms "first," "second," etc. are used only as labels, rather than a limitation for a number of the objects. It is understood that if multiple components are shown, the components may be referred to as a "first" component, a "second" component, and so forth, to the extent applicable.

Disjunctive language, such as the phrase "at least one of X, Y, or Z," unless specifically stated otherwise, is to be understood with the context as used in general to present that an item, term, etc., can be either X, Y, or Z, or any combination thereof (e.g., X, Y, and/or Z). Thus, such disjunctive language is not generally intended to, and should not, imply that certain embodiments require at least one of X, at least one of Y, or at least one of Z to be each present.

The above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. A solid-state circuit breaker (SSCB), comprising:
    a first transistor and a second transistor being connected in series, a gate of the first transistor being connected to a first gate resistor and a gate of the second transistor being connected to a second gate resistor;
    a first diode connected to the first gate resistor and the second gate resistor;
    at least one resistor-capacitor (RC) snubber circuit connected in parallel to at least one of the first transistor and the second transistor;
    at least one metal-oxide varistor (MOV) connected between an emitter of the first transistor and the gate of the second transistor, the at least one MOV operable to discharge or turn off the second transistor; and
    a gate driver connected to the first diode and an emitter of at least one of the first transistor and the second transistor.

2. The solid-state circuit breaker according to claim 1, further comprising:
    a third transistor being connected in series with the first transistor and the second transistor, the third transistor being connected to a third gate resistor; and
    a second diode connected between the second gate resistor and the third gate resistor.

3. The solid-state circuit breaker according to claim 2, wherein the at least one MOV comprises:
    a first MOV connected in parallel with the first transistor, a second MOV connected in parallel with the second transistor, and a third MOV connected in parallel with the third transistor.

4. The solid-state circuit breaker according to claim 3, further comprising:
    a first gate emitter diode and a first gate emitter capacitor connected to a gate and an emitter of the second transistor; and
    a second gate emitter diode and a second gate emitter capacitor connected to a gate and an emitter of the third transistor.

5. The solid-state circuit breaker according to claim 4, wherein the at least one RC snubber circuit comprises:
    a first RC snubber circuit connected in parallel to the first transistor;
    a second RC snubber circuit connected in parallel to the second transistor; and
    a third RC snubber circuit connected in parallel to the third transistor.

6. The solid-state circuit breaker according to claim 5, wherein:
the first RC snubber circuit comprises a first snubber circuit resistor and a first snubber circuit capacitor;
the second RC snubber circuit comprises a second snubber circuit resistor and a second snubber circuit capacitor; and
the third RC snubber circuit comprises a third snubber circuit resistor and a third snubber circuit capacitor.

7. The solid-state circuit breaker according to claim 2, wherein the at least one MOV is a single MOV connected in parallel to an emitter of the first transistor and a collector of the third transistor.

8. The solid-state circuit breaker according to claim 7, wherein the at least one RC snubber circuit is a single RC snubber circuit connected in parallel to the emitter of the first transistor and the collector of the third transistor.

9. The solid-state circuit breaker according to claim 8, further comprising:
a first transient-voltage-suppression diode in parallel with a first resistor, each being connected to a gate of the second transistor; and
a second transient-voltage-suppression diode in parallel with a second resistor, each being connected to a gate of the third transistor.

10. The solid-state circuit breaker according to claim 9, wherein the single MOV is a high-voltage MOV.

11. A method, comprising:
providing a circuit breaker, comprising:
a first transistor and a second transistor being connected in series, a gate of the first transistor being connected to a first gate resistor and a gate of the second transistor being connected to a second gate resistor;
a first diode connected to the first gate resistor and the second gate resistor;
at least one resistor-capacitor (RC) snubber circuit connected in parallel to at least one of the first transistor and the second transistor;
at least one metal-oxide varistor (MOV) connected between an emitter of the first transistor and the gate of the second transistor, the at least one MOV operable to discharge or turn off the second transistor; and
a gate driver connected to the first diode and the emitter of the first transistor or an emitter of the second transistor; and
driving the circuit breaker using the gate driver.

12. The method according to claim 11, wherein the circuit breaker as provided further comprises:
a third transistor being connected in series with the first transistor and the second transistor, the third transistor being connected to a third gate resistor; and
a second diode connected between the second gate resistor and the third gate resistor.

13. The method according to claim 12, wherein the at least one MOV comprises:
a first MOV connected in parallel with the first transistor, a second MOV connected in parallel with the second transistor, and a third MOV connected in parallel with the third transistor.

14. The method according to claim 13, wherein the circuit breaker as provided comprises:
a first gate emitter diode and a first gate emitter capacitor connected to a gate and the emitter of the second transistor; and
a second gate emitter diode and a second gate emitter capacitor connected to a gate and an emitter of the third transistor.

15. The method according to claim 14, wherein the at least one RC snubber circuit comprises:
a first RC snubber circuit connected in parallel to the first transistor;
a second RC snubber circuit connected in parallel to the second transistor; and
a third RC snubber circuit connected in parallel to the third transistor.

16. The method according to claim 15, wherein:
the first RC snubber circuit comprises a first snubber circuit resistor and a first snubber circuit capacitor;
the second RC snubber circuit comprises a second snubber circuit resistor and a second snubber circuit capacitor; and
the third RC snubber circuit comprises a third snubber circuit resistor and a third snubber circuit capacitor.

17. The method according to claim 12, wherein the at least one MOV is a single MOV connected in parallel to the emitter of the first transistor and a collector of the third transistor.

18. The method according to claim 17, wherein the at least one RC snubber circuit is a single RC snubber circuit connected in parallel to the emitter of the first transistor and the collector of the third transistor.

19. The method according to claim 18, wherein the circuit breaker as provided further comprises:
a first transient-voltage-suppression diode in parallel with a first resistor, each being connected to a gate of the second transistor; and
a second transient-voltage-suppression diode in parallel with a second resistor, each being connected to a gate of the third transistor.

20. The method according to claim 19, wherein the single MOV is a high-voltage MOV.

* * * * *